United States Patent
Bilski

(10) Patent No.: US 6,703,862 B1
(45) Date of Patent: Mar. 9, 2004

(54) EFFICIENT LOADABLE REGISTERS IN PROGRAMMABLE LOGIC DEVICES

(75) Inventor: Goran Bilski, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/253,095

(22) Filed: Sep. 24, 2002

(51) Int. Cl.$^7$ .............................................. A03K 19/173

(52) U.S. Cl. .............................. 326/46; 326/38; 326/40

(58) Field of Search ............................. 326/37, 38, 39, 326/40, 41, 46

(56) References Cited

U.S. PATENT DOCUMENTS 5,844,422 A * 12/1998 Trimberger et al. .......... 326/38
6,057,706 A *  5/2000 Barbier et al. ................ 326/39

OTHER PUBLICATIONS

Xilinx, Inc.; "Virtex–II Platform FPGA Handbook"; published Dec. 2000, available from Xilinx, Inc,, 2100 Logic Drive, San Jose, California 95124; pp. 33–75.

* cited by examiner

Primary Examiner—Anh Tran
(74) Attorney, Agent, or Firm—Lois D. Cartier

(57) ABSTRACT

Efficient register circuits allow the loading of data values into a memory element using set and reset terminals in addition to loading via the data input terminal. A register circuit includes a memory element and a logical AND gate. A load command input terminal enables the load, and a load value input terminal provides the new value to be loaded. The memory element has set and reset terminals. In one embodiment, the reset function overrides the set function when both terminals provide active signals. The set terminal is coupled to the load command input terminal. The logical AND gate has input terminals coupled to the load command and load value input terminals, and an output terminal coupled to the reset terminal of the memory element. In another embodiment, the set function overrides the reset function, and the signals driving the set and reset terminals are reversed.

30 Claims, 10 Drawing Sheets

EFFICIENT LOADABLE REGISTERS IN PROGRAMMABLE LOGIC DEVICES

FIELD OF THE INVENTION

The invention relates to Programmable Logic Devices (PLDs). More particularly, the invention relates to efficient register implementations for PLDs.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLs, RAM, and so forth).

The CLBs, IOBS, interconnect, and other logic blocks are typically programmed by loading a stream of configuration data (bitstream) into internal configuration memory cells that define how the CLBs, IOBs, and interconnect are configured. The configuration data can be read from memory (e.g., an external PROM) or written into the FPGA by an external device. The collective states of the individual memory cells then determine the function of the FPGA.

One such FPGA, the Xilinx Virtex®-II FPGA, is described in detail in pages 33–75 of the "Virtex-II Platform FPGA Handbook", published December, 2000, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

FIG. 1 is a simplified block diagram of a Virtex-II CLB 100. The CLB includes four similar slices SLICE_0 through SLICE_3. Each slice includes two 4-input function generators (101, 102) which can be configured to function either as 4-input lookup tables or as distributed RAM blocks. When in RAM mode, the write process is controlled by write strobe generator 111, which provides write strobe signals WS to the function generators (101, 102). (In the present specification, the same reference characters are used to refer to terminals, signal lines, and their corresponding signals.) The RAM input data is supplied by direct input terminals RAM_DI_1 and RAM_DI_2.

Each function generator (101, 102) supplies an output signal to an associated multiplexer (MUX1, MUX2), which in turn supplies a data input to an associated memory element (121, 122). Direct input terminals Reg_DI_1, Reg_DI_2 also drive multiplexers MUX1, MUX2, respectively, allowing independent signals to be loaded into the memory elements. Multiplexers MUX1 and MUX2 are controlled by configuration memory cells (131, 132). Thus, once the CLB is configured, only one of the function generator output signal and the direct input signal can provide data to the data input terminal of each memory cell.

Memory elements 121, 122 are controlled by clock CK and clock enable CE signals (supplied by direct input terminals, not shown), and by memory control signals. The memory control signals of a Virtex-II memory element include a set/reset select signal SR_Sel (which determines whether the memory element is a set or a reset element), a set/reset enable signal SR_En (which initializes the memory element based on the value of the set/reset select signal), and a reverse enable signal SR_Rev (which initializes the memory element to the opposite state from that initiated by the signal SR_En). If both signals SR_En and SR_Rev are active, the signal performing the reset function takes precedence, and the signal performing the set function is ignored.

The value of the set/reset select signal SR_Sel is controlled by a configuration memory cell (141, 142). Set/reset enable signal SR_En is supplied by a direct input terminal, as shown in FIG. 1. Reverse enable signal SR_Rev is configurably supplied by the Reg_DI_1 terminal, which, as noted above, can also be used to supply a direct input to the data input terminal of memory element 121.

One feature of a CLB that can be important in some applications is the time required to load new data from the function generators into the memory elements. As seen in FIG. 1, the path between each function generator and the associated memory element traverses a multiplexer (MUX1, MUX2) that is needed to allow a data write from the direct input terminal (Reg_DI_1, Reg_DI_2). Thus, the direct write capability slows down all circuits that register the function generator output signal in the same slice, even when the direct write capability is not used.

Further, the MUX1, MUX2 multiplexers are controlled by configuration memory cells 131, 132. Thus, as noted above, once the CLB is configured only one of the function generator output signal and the direct input signal can provide data to the data input terminal of each memory cell. To implement a user circuit that requires multiple signals optionally supplying data to the memory element, one or more multiplexers are typically added to the data path prior to the MUX1, MUX2 multiplexers. The additional logic in the data path can require additional levels of logic, slowing down the overall operation of the user circuit.

It would be desirable to provide a CLB architecture for a PLD that would permit both direct register loading and the loading of data from a function generator of the CLB into an associated memory element without passing through a multiplexer such as MUX1 and MUX2. It would further be desirable to provide a CLB architecture that would permit both direct register loading and the loading of data from a function generator of the CLB into an associated memory element under user control rather than as a configuration option. It would also be desirable to provide a register circuit implementation for existing CLB architectures that permits the same flexibility as the proposed new CLB architectures.

SUMMARY OF THE INVENTION

The invention provides efficient register implementations that are particularly useful in programmable logic devices (PLDs). The register circuits of the invention allow the loading of data values into a memory element using set and reset terminals in addition to the data input terminal of the memory element. Thus, traditional loading through the data input terminal is not slowed by the addition of the new functionality. PLD configurable logic blocks (CLBs) typically include function generators that drive the data input terminals of the associated memory elements. This traditional functionality can be retained while the new functionality allows an additional path through which data can be loaded to the memory element under user control.

According to a first aspect of the invention, a register circuit includes a memory element and a logical AND gate. Two register input terminals control the new load functionality, a load command input terminal that enables the load, and a load value input terminal that provides the new value to be loaded. The memory element has set and reset terminals in addition to the data and clock input terminals, and the reset function overrides the set function when both terminals provide active signals. The set terminal of the memory element is coupled to the load command input terminal of the register. The logical AND gate has input terminals coupled to the load command and load value input terminals, and an output terminal coupled to the reset terminal of the memory element.

Some register circuits are more than one bit wide. These embodiments include additional memory elements and additional logical AND circuits. The load command input signal is shared among all the memory elements, while a separate load value input signal is provided for each bit.

In some embodiments, the load value is inverted prior to the performance of the AND function. In these embodiments, the true value of the load value is loaded into the memory element. In other embodiments, the load value is not inverted prior to the logical AND gate. In these embodiments, the complement value of the load value is loaded into the memory element. In some embodiments, the logical AND gate is implemented as a NOR gate with input signals inverted from those of the logical AND gate. In other embodiments, the logical AND gate is implemented as a NAND gate and the reset terminal of the memory element is an active low input terminal.

Some embodiments of the register circuit are implemented in a PLD. In these embodiments, the logical AND gate can be implemented either by programming a function generator of the PLD or by using a dedicated logic gate hard-wired into the PLD.

In some embodiments, the memory element is implemented with a set/reset enable terminal, a reverse enable terminal, and a set/reset select terminal that assigns the set/reset and reverse enable terminals to function as set and reset terminals. The set/reset select terminal is programmed using a configuration memory cell to appropriately provide the load command input signal and the output of the logical AND gate to the memory element set and reset input terminals.

Some PLD embodiments include programmable means for configuring the load value input terminal as a reset terminal, and the load command input terminal as a set terminal.

According to a second aspect of the invention, a register circuit includes a memory element and a logical AND gate. Two register input terminals control the new load functionality, a load command input terminal that enables the load, and a load value input terminal that provides the new value to be loaded. The memory element has set and reset terminals in addition to the data and clock input terminals. However, according to this aspect of the invention, the set function overrides the reset function when both terminals provide active signals. The reset terminal of the memory element is coupled to the load command input terminal of the register. The logical AND gate has input terminals coupled to the load command and load value input terminals, and an output terminal coupled to the set terminal of the memory element.

Embodiments of the invention similar to those described above can also be applied to this second aspect of the invention. For example, some PLD embodiments include programmable means for configuring the load value input terminal as a set terminal, and the load command input terminal as a reset terminal.

Other embodiments of the invention provide CLB and PLD architectures and implementations that include register circuits similar to those described above.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

The present invention is believed to be applicable to a variety of electronic circuits, including, but not limited to, programmable logic devices (PLDs). The present invention has been found to be particularly applicable and beneficial for PLDS such as field programmable gate arrays (FPGAs) having configurable logic blocks (CLBs). An appreciation of the present invention is presented by way of specific examples, including exemplary novel CLB architectures and circuit implementations targeted to Virtex-II FPGAs. However, the present invention is not limited to PLDs, FPGAs, or the specific architectures described herein, which are illustrated for exemplary purposes.

Further, in the following description, numerous specific details are set forth to provide a more thorough understanding of the present invention. However, it will be apparent to one skilled in the art that the present invention can be practiced without these specific details.

Figure 2:
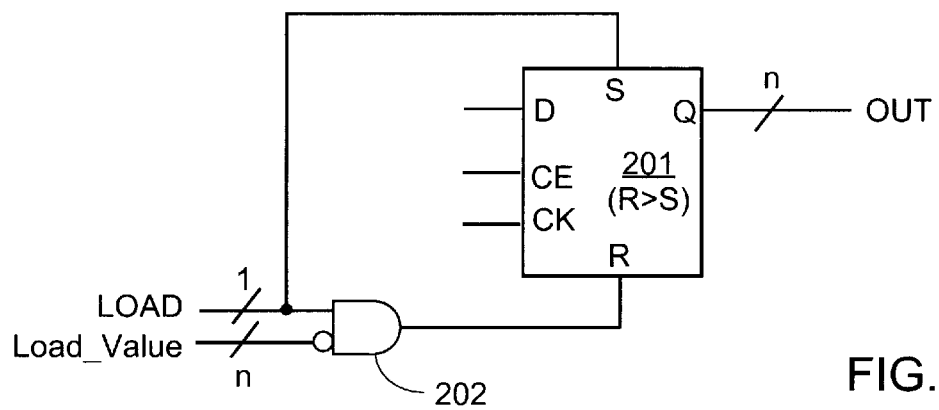
FIG. 2 is a circuit diagram of a first register circuit having a load function that bypasses the data input terminal of the register.

FIG. 2 is a circuit diagram illustrating a first aspect of the invention. The circuit of FIG. 2 implements a register circuit having a load function that bypasses the data input terminal of the register. The register circuit includes a set/reset memory element 201 and a logical AND gate 202. Memory element 201 has both set and reset input terminals. Importantly, in the embodiment of FIG. 2 an active signal on the reset terminal takes precedence over an active signal on the set terminal. In other words, if both the set and reset functions are enabled, memory element 201 resets. Such memory elements are well known.

Logical AND gate 202 has a first input terminal coupled to a load command input terminal (LOAD) and further coupled to the set terminal of memory element 201. Logical AND gate 202 further has a second input terminal coupled to a load value input terminal (Load_Value). In the pictured embodiment, the load value is inverted prior to the AND function. Logical AND gate 202 also has an output terminal coupled to the reset terminal of memory element 201.

The register circuit of FIG. 2 functions as follows. To load a high value through the set and reset terminals, a high value is presented at the load value input terminal (Load_Value), and a high value is presented at the load command input terminal (LOAD). Thus, a high value is provided to the set terminal S, and a low value is provided to the reset terminal R, of memory element 201. Memory element 201 is set, i.e., a high value is loaded.

To load a low value through the set and reset terminals, a low value is presented at the load value input terminal (Load_Value), and a high value is presented at the load command input terminal (LOAD). Thus, a high value is provided to the set terminal S, and a high value is provided to the reset terminal R, of memory element 201. Thus, both the set and reset functions are enabled. As described above, the reset function takes precedence over the set function. Thus, memory element 201 is reset, i.e., a low value is loaded.

Note that additional register bits can be added (for a total of n bits as indicated in FIG. 2) by adding additional memory elements and logical AND circuits. The load command input terminal is shared among all bits, while a separate load value input signal is provided for each bit.

Figure 4:
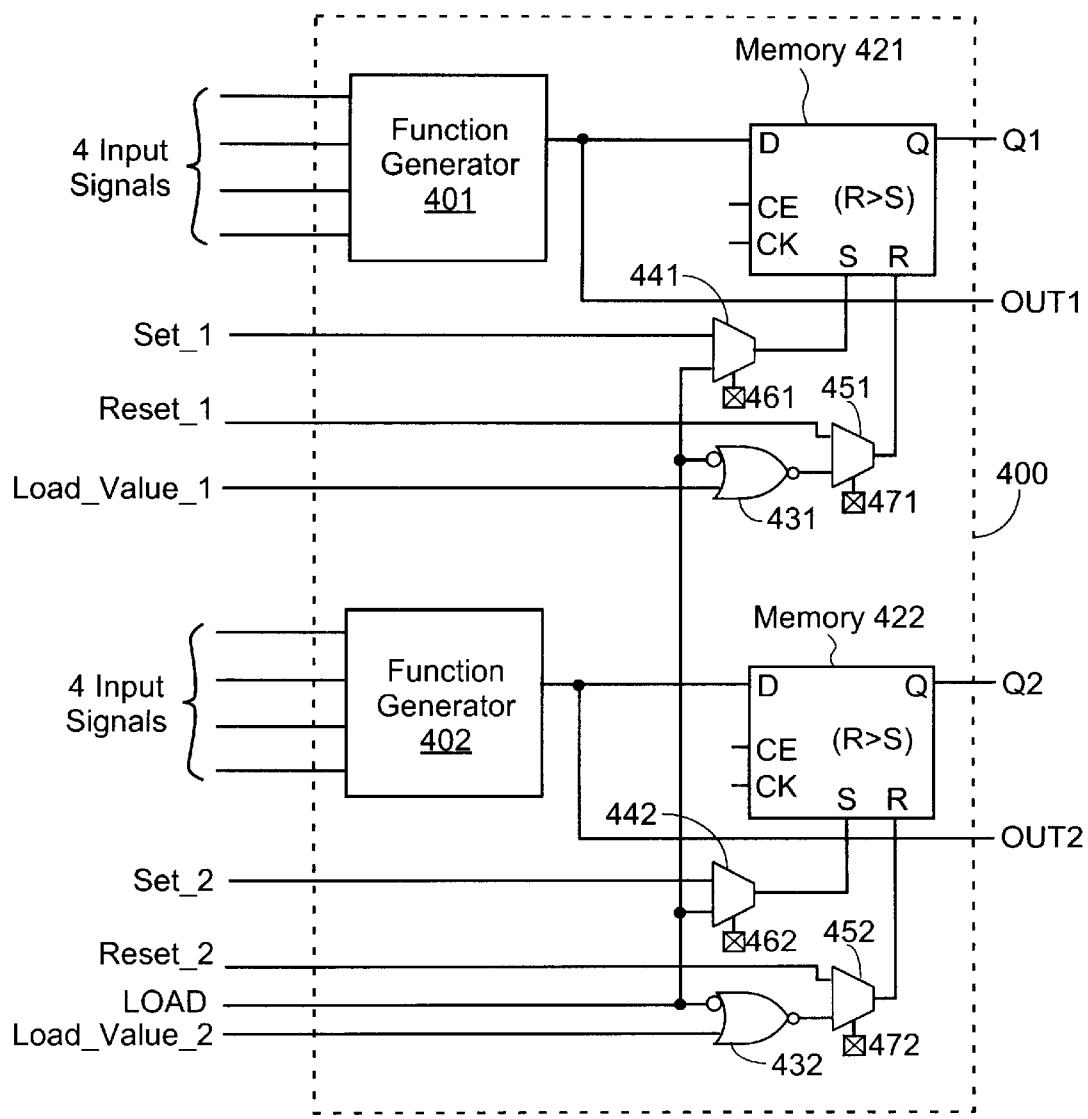
FIG. 4 illustrates a portion of a second CLB architecture that includes another implementation of the circuit of FIG. 2.
Figure 5:
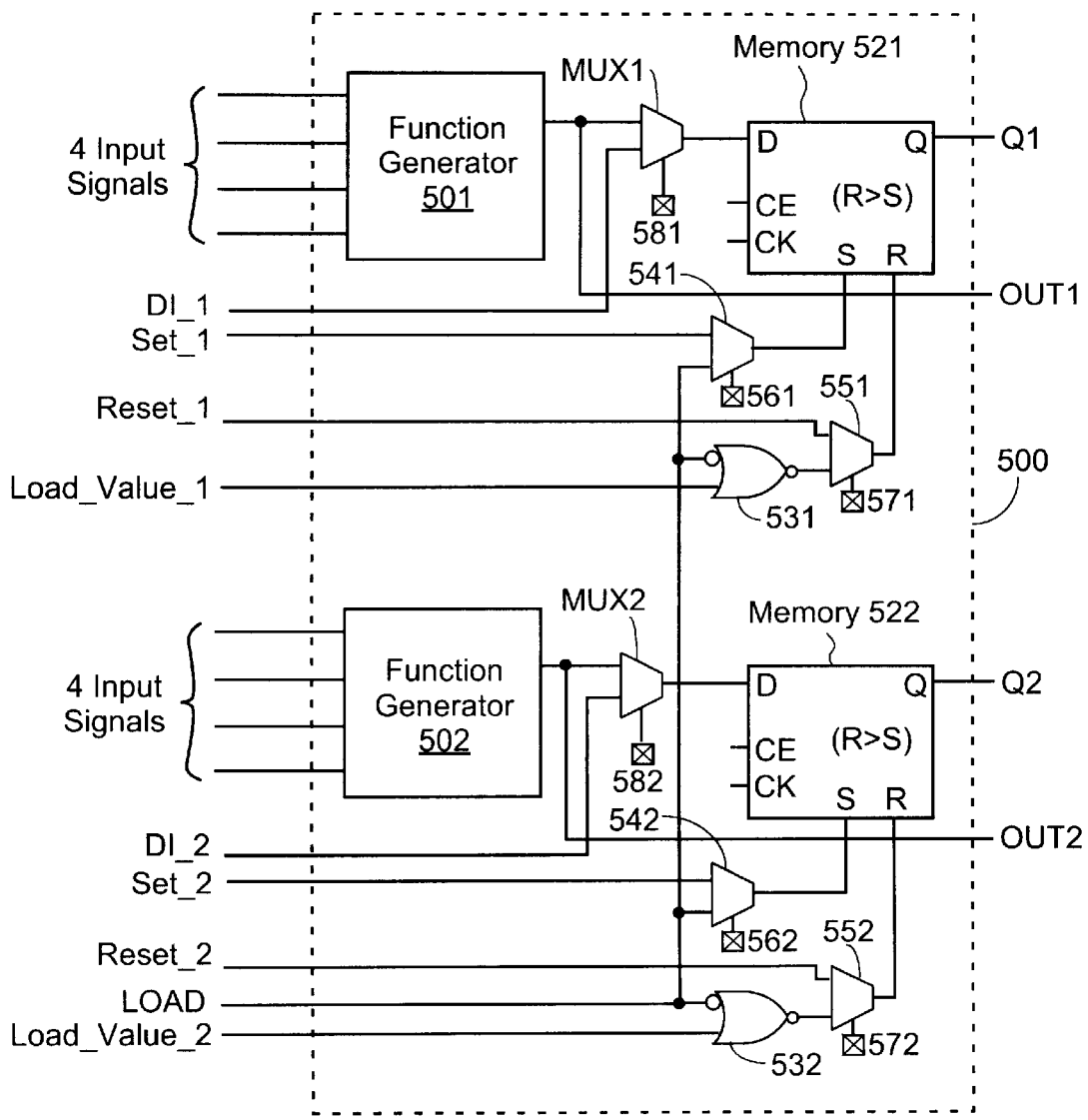
FIG. 5 illustrates a portion of a third CLB architecture that includes yet another implementation of the circuit of FIG. 2.

The circuit of FIG. 2 can be implemented in many different ways. For example, an integrated circuit can be designed and manufactured that includes the memory element and logical AND gate in dedicated (hard-wired) circuits. One such integrated circuit, for example, can be a PLD in which these elements are incorporated into the CLB architecture. Exemplary CLB architectures incorporating these elements are illustrated in FIGS. 3–5.

Another way in which the circuit of FIG. 2 can be implemented is by using the programmable logic available in PLDs. PLDs typically include CLBs that include memory circuits and programmable function generators. Logical AND gate 202 can be implemented using the programmable function generators of the CLB. Memory element 201 can be implemented using the memory elements of the CLB. Note that when an existing PLD architecture is used with the embodiment of FIG. 2, the memory elements must have a reset function that takes precedence over the set function. Exemplary implementations of this type are shown in FIGS. 6–9.

Figure 3:
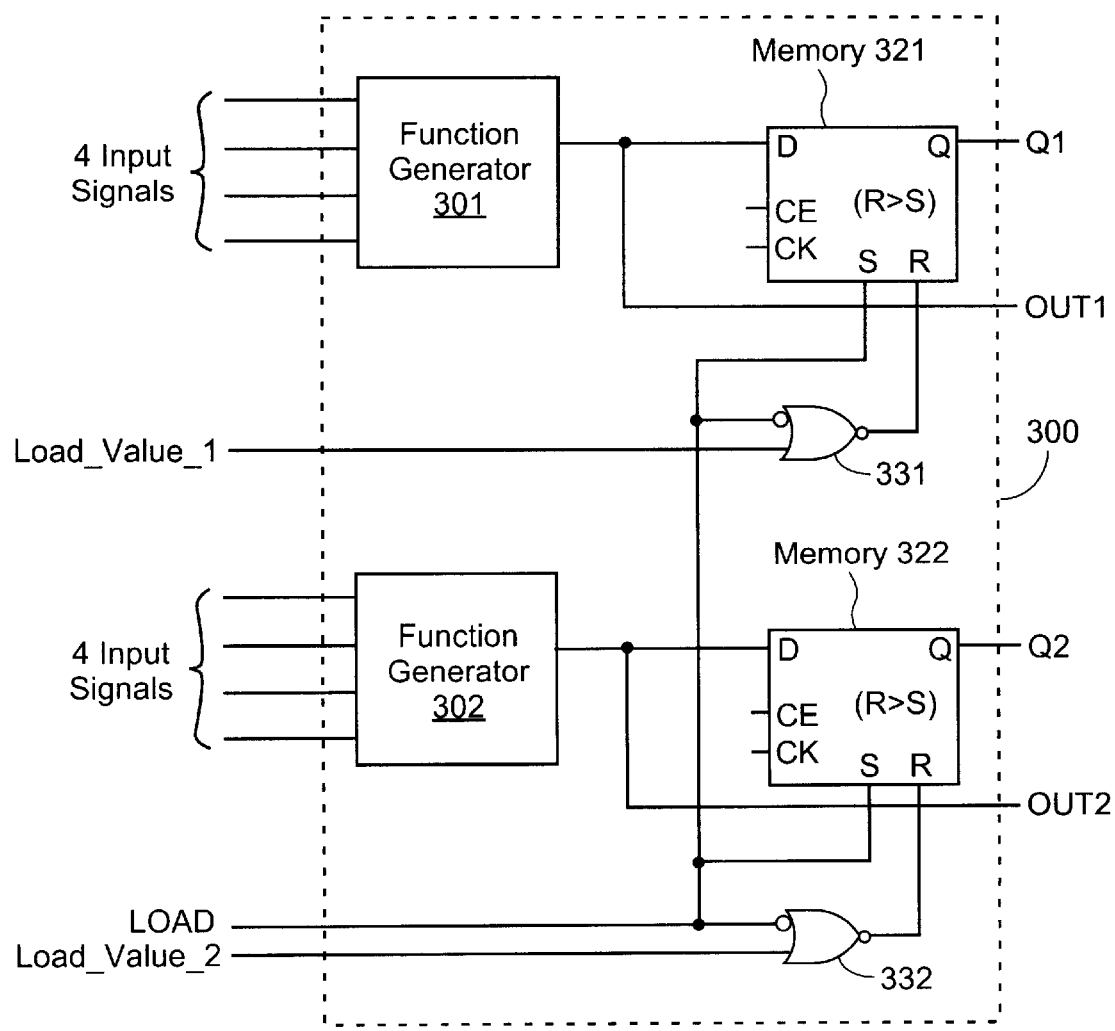
FIG. 3 illustrates a portion of a first configurable logic block (CLB) architecture that includes one implementation of the circuit of FIG. 2.

FIG. 3 illustrates a first exemplary CLB architecture 300 that includes the register circuit of FIG. 2. Circuit 300 can be a CLB or a portion of a CLB, e.g., a slice. Circuit 300 includes two function generators 301, 302, two memory elements 321, 322, and two logical AND gates 331, 332.

Function generators 301, 302 have a plurality of input terminals and an output terminal. The output terminal of each function generator 301, 302 is coupled to the data input terminal D of an associated memory element 321, 322, and is also coupled to an output terminal OUT1, OUT2 of the CLB.

Memory elements 321, 322 each have a clock terminal CK, an optional clock enable terminal CE, a data input terminal D coupled to the output terminal of a corresponding function generator 301, 302, a register output terminal Q, and set and reset terminals (S, R, respectively). The reset function of each memory element overrides the set function when both of the set and reset terminals provide active signals. The set terminal S of each memory element is coupled to a load command input terminal LOAD of the CLB.

Logical AND gates 331, 332 are implemented in this architecture as NOR gates. The input signals to the NOR gates are inverted compared to the input signals to the logical AND; therefore, the functionality is unchanged. The logical AND gates are each driven by the load command signal LOAD and an associated load value signal Load_Value_1,2. The output terminal of each logical AND gate is coupled to the reset terminal of the associated memory element.

While a CLB (or CLB portion) including two function generators, two memory elements, and two AND gates is shown in each of FIGS. 3–5, any convenient number of these elements can be included. The circuit shown is used as an example because it is common for a CLB or a CLB slice to include this number of elements. However, the invention is not so limited.

The CLB architecture of FIG. 3 improves the PLD implementation of certain user circuits. For example, suppose the memory elements of the CLB are used to implement an accumulator for a microprocessor. The primary path for loading data into the accumulator is via the function generator and the data input terminal of each memory element. Now suppose that a test mode needs to be added to the microprocessor, in which test data can be loaded directly into the accumulator.

Clearly, the test mode should not be allowed to slow down the primary operation of the accumulator, i.e., the load path through the data input terminal. The test mode can be implemented by adding a 2-to-1 multiplexer on the logic path prior to the data input terminal of the memory element. However, unless the function generator is able to accommodate the additional logic, this implementation adds an additional logic level (e.g., an additional function generator) to the primary load path. On the other hand, using the set and reset terminals of the memory element to load the test value adds the test capability without slowing the primary operation of the accumulator.

FIG. 4 illustrates a second exemplary CLB architecture 400 that includes the register circuit of FIG. 2. Circuit 400 is similar to circuit 300 of FIG. 3, but includes the additional functionality of programmably allowing access to the set and reset terminals of the memory elements by signals from outside the CLB. Portions of the figure that are similar to FIG. 3 are not described.

Between the load command input terminal LOAD and the set terminal S of each memory element 421, 422 is a multiplexer 441, 442. Under the control of a memory cell 461, 462, each multiplexer selects one of a direct input set signal Set_1, Set_2 and the load command input signal LOAD to drive the set terminal S of the associated memory element 421, 422. Similarly, between the output terminal of the logical AND gate 431, 432 and the reset terminal R of each memory element 421, 422 is a multiplexer 451, 445. Under the control of a memory cell 471, 472, each multiplexer selects one of a direct input reset signal Reset_1, Reset_2 and the logical AND output signal to drive the reset terminal R of the associated memory element 421, 422.

Thus, the capability to load via the set and reset signals can be programmably enabled or disabled. When disabled, the user can directly control the set and reset signals via the Set_1,2 and Reset_1,2 input terminals.

FIG. 5 illustrates a third exemplary CLB architecture 500 that includes the register circuit of FIG. 2. Circuit 500 is similar to circuit 400 of FIG. 4, but includes the additional functionality of programmably selecting either the function generator output signal or a direct input data signal to write to the memory element via the memory element data input terminal. Portions of the figure that are similar to FIG. 4 are not described.

Between the function generator output terminal and the data input terminal D of each memory element 521, 522 is a multiplexer MUX1, MUX2. Under the control of a memory cell 581, 582, each multiplexer MUX1, MUX2 selects either the output signal of the associated function generator 501, 502 or a direct input signal DI_1, DI_2 to drive the data input terminal D of the associated memory element 521, 522.

Many other CLB architectures can also be devised that incorporate the set/reset load functionality of the invention.

As described above, the register circuit of FIG. 2 can also be implemented in CLB architectures that lack a dedicated logical AND circuit, provided the CLB includes memory elements with a reset function that takes precedence over the set function.

Figure 6:
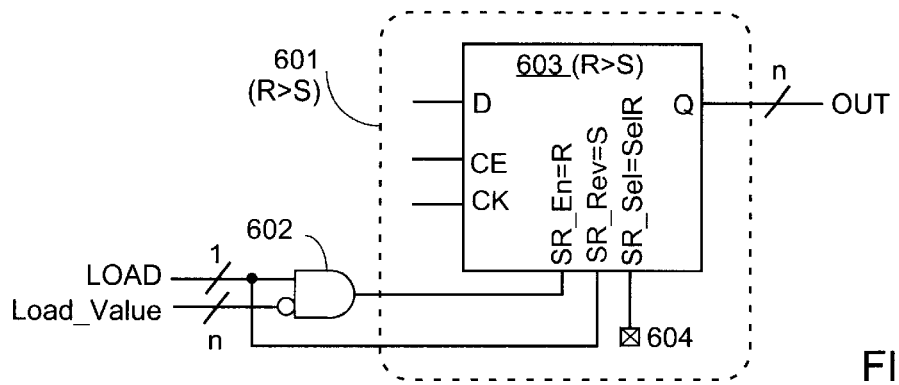
FIG. 6 shows one way in which the circuit of FIG. 2 can be implemented using a Virtex-II memory element.
Figure 8:
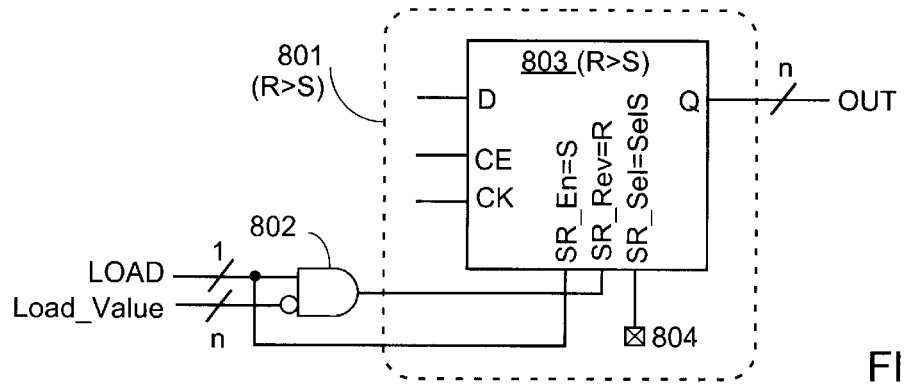
FIG. 8 shows another way in which the circuit of FIG. 2 can be implemented using a Virtex-II memory element.

FIGS. 6 and 8 show two different ways in which the circuit of FIG. 2 can be implemented using a Virtex-II memory element. As described in connection with FIG. 1, the Virtex-II memory element is driven by three memory control signals. The memory control signals include a set/reset select signal SR_Sel (which determines whether the memory element is a set or a reset element), a set/reset enable signal SR_En (which initializes the memory element based on the value of the set/reset select signal), and a reverse enable signal SR_Rev (which initializes the memory element to the opposite state from that initiated by the signal SR_En). If both signals SR_En and SR_Rev are active, the signal performing the reset function takes precedence, and the signal performing the set function is ignored.

Therefore, either the SR_En or the SR_Rev terminal can be used to provide the reset signal, depending on the value of signal SR_Sel, which is stored in configuration memory cell 604 (FIG. 6) or configuration memory cell 804 (FIG. 8). The one of these two input terminals that is not providing the reset signal is used to provide the set signal.

In FIG. 6, the portion of the figure labeled 601 illustrates one embodiment of memory element 201 of FIG. 2. Portion 601 includes memory element 603 and configuration memory cell 604. Configuration memory cell 604 is set to a value that designates the SR_En terminal as the reset terminal and the SR_Rev terminal as the set terminal. (As shown in FIG. 6, the value SR_Sel=SelR indicates that the reset function is assigned to the SR_En terminal.) Thus, the output of logical AND gate 602 (which is the reset signal, as shown in FIG. 2) is coupled to the SR_En terminal of memory element 603. The load command input terminal LOAD provides the set signal, as shown in FIG. 2. Therefore, the LOAD terminal is coupled to the SR_Rev terminal of memory element 603.

Figure 1:
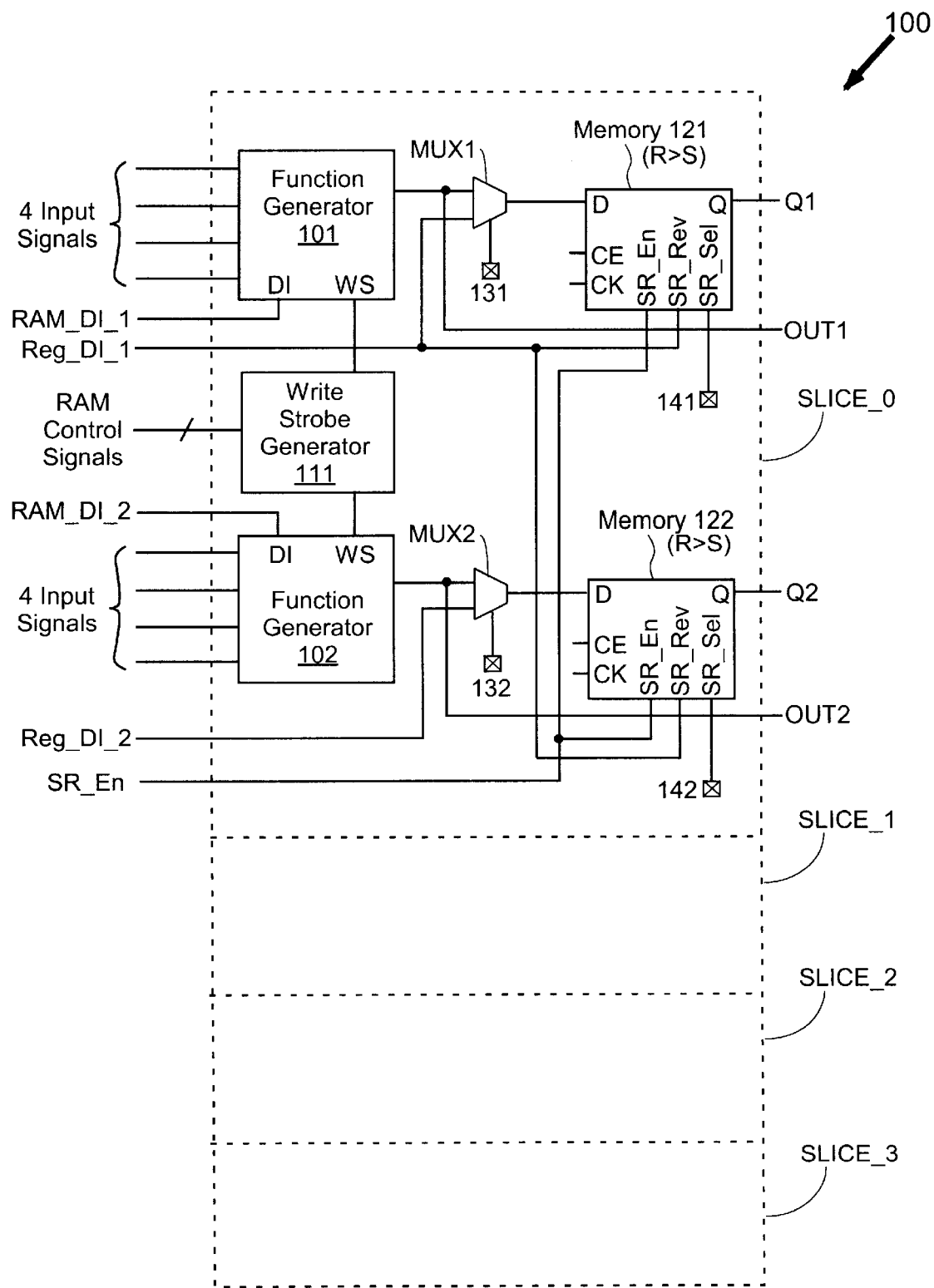
FIG. 1 is a simplified circuit diagram of a Virtex-II CLB.
Figure 7:
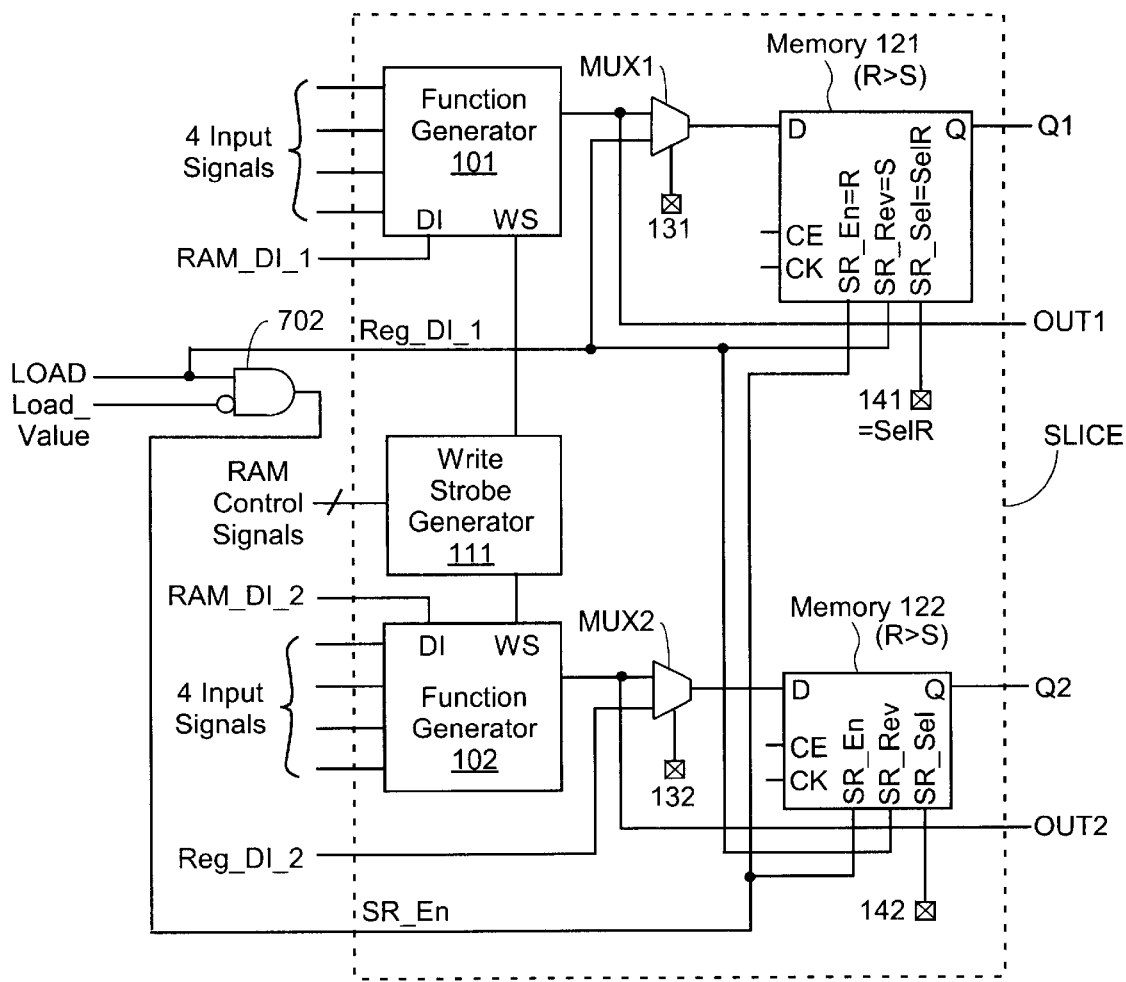
FIG. 7 shows one way in which the circuit of FIG. 6 can be implemented in a Virtex-II CLB.

FIG. 7 shows one way in which the embodiment of FIG. 6 can be implemented in a Virtex-II CLB (see FIG. 1). Memory element 603 of FIG. 6 is mapped to memory element 121 of FIG. 1. Logical AND gate 602/702 is implemented using a function generator in the same or another CLB. Note that when implementing the circuit of FIG. 2 in a Virtex-II CLB, only one of the two memory elements in the slice can be used to implement the register. This limitation is due to the fact that both memory elements share common SR_En and SR_Rev signals, so two different load values cannot be applied to the two memory elements using this technique.

In FIG. 8, the portion of the figure labeled 801 illustrates another embodiment of memory element 201 of FIG. 2. Portion 801 includes memory element 803 and configuration memory cell 804. Configuration memory cell 804 is set to a value that designates the SR_En terminal as the set terminal and the SR_Rev terminal as the reset terminal. (As shown in FIG. 8, the value SR_Sel=SelS indicates that the set function is assigned to the SR_En terminal.) Thus, the output of logical AND gate 802 (which is the reset signal, as shown in FIG. 2) is coupled to the SR_Rev terminal of memory element 803. The load command input terminal LOAD provides the set signal, as shown in FIG. 2. Therefore, the LOAD terminal is coupled to the SR_En terminal of memory element 803.

Figure 9:
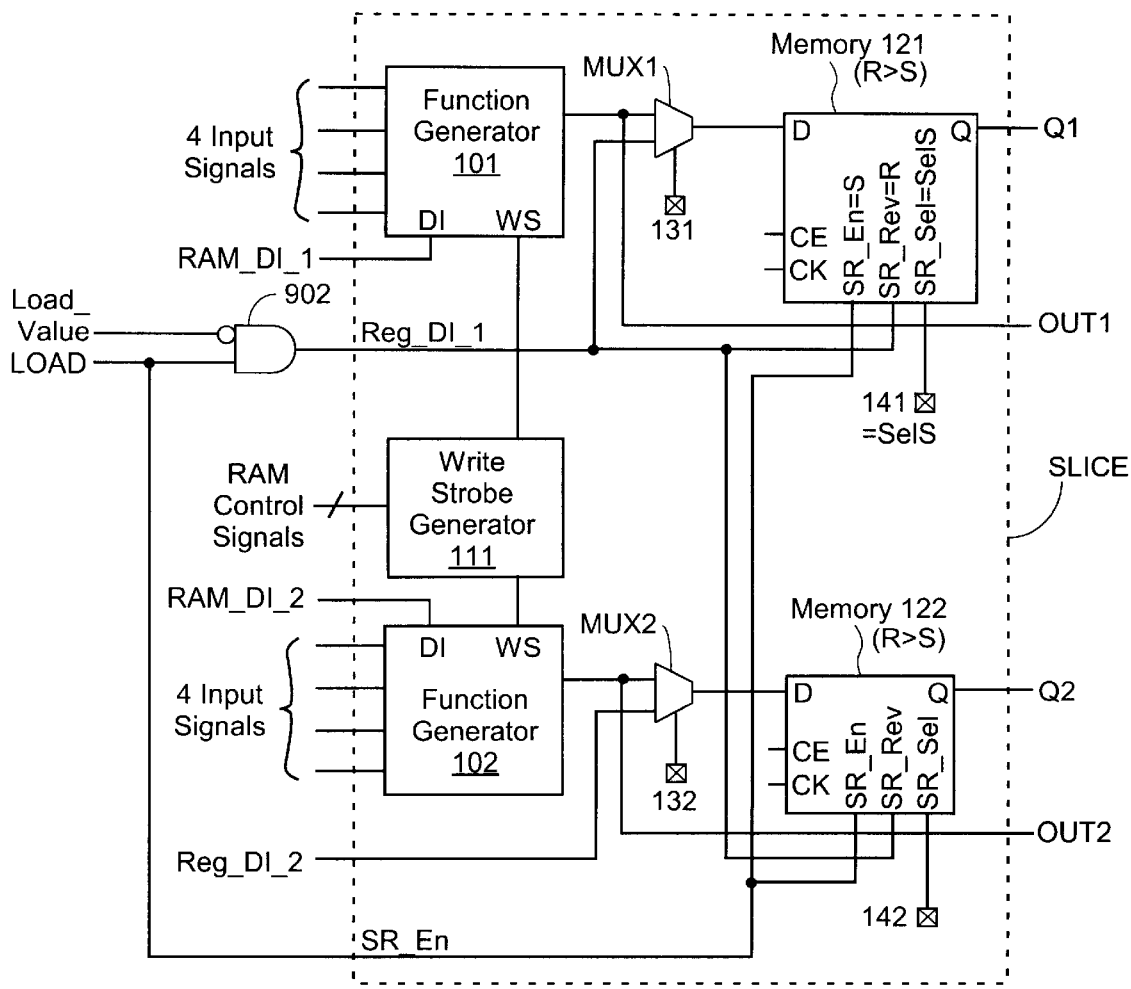
FIG. 9 shows one way in which the circuit of FIG. 8 can be implemented in a Virtex-II CLB.

FIG. 9 shows one way in which the embodiment of FIG. 8 can be implemented in a Virtex-II CLB (see FIG. 1). Memory element 803 of FIG. 8 is mapped to memory element 121 of FIG. 1. Logical AND gate 802/902 is implemented using a function generator in the same or another CLB.

FIGS. 2–9 illustrate embodiments wherein a register circuit is implemented using a memory element where the reset function takes precedence over the set function. However, the invention can also be applied to memory elements that give priority to the set function. In the embodiments of FIGS. 10–13, if both the set and reset functions are enabled, the memory element is set. Such memory elements are well known.

Figure 10:
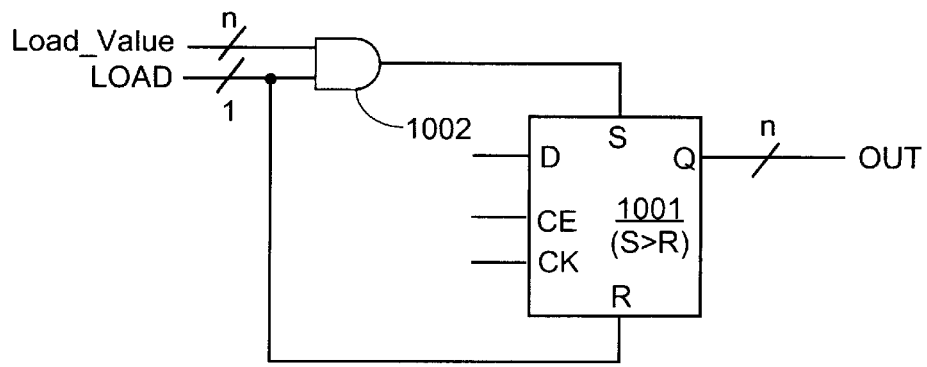
FIG. 10 is a circuit diagram of a second register circuit having a load function that bypasses the data input terminal of the register.

FIG. 10 illustrates a second register circuit having a load function that bypasses the data input terminal of the register. As in the embodiment of FIG. 2, the register circuit includes a set/reset memory element 1001 and a logical AND gate 1002. Memory element 1001 has both set and reset input terminals, with an active signal on the set terminal taking precedence over an active signal on the reset terminal.

Logical AND gate 1002 has a first input terminal coupled to a load command input terminal (LOAD) and further coupled to the reset terminal of memory element 1001. Logical AND gate 1002 further has a second input terminal coupled to a load value input terminal (Load_Value). In the pictured embodiment, no inversion takes place between the input terminals and the AND function. Logical AND gate 1002 also has an output terminal coupled to the set terminal of memory element 1001.

The register circuit of FIG. 10 functions as follows. To load a high value through the set and reset terminals, a high value is presented at the load value input terminal (Load_Value), and a high value is presented at the load command input terminal (LOAD). Thus, a high value is provided to the reset terminal R, and a high value is also provided to the set terminal S, of memory element 1001. Both the set and reset functions are enabled. As described above, the set function takes precedence over the reset function. Thus, memory element 1001 is set, i.e., a high value is loaded.

To load a low value through the set and reset terminals, a low value is presented at the load value input terminal (Load_Value), and a high value is presented at the load command input terminal (LOAD). Thus, a high value is provided to the reset terminal R, and a low value is provided to the set terminal S, of memory element 1001. Thus, memory element 1001 is reset, i.e., a low value is loaded.

As in the register circuit of FIG. 2, additional register bits can be added (for a total of n bits as indicated in FIG. 10) by adding additional memory elements and logical AND circuits. The load command input terminal is shared among all bits, while a separate load value input signal is provided for each bit.

The circuit of FIG. 10 can be implemented in many different ways, similar to the embodiment of FIG. 2. Only a few of these implementations are illustrated here, for exemplary purposes. Additional implementations will be apparent to those of skill in the art of logical design, e.g., by altering the embodiments pictured in FIGS. 3–9.

Figure 11:
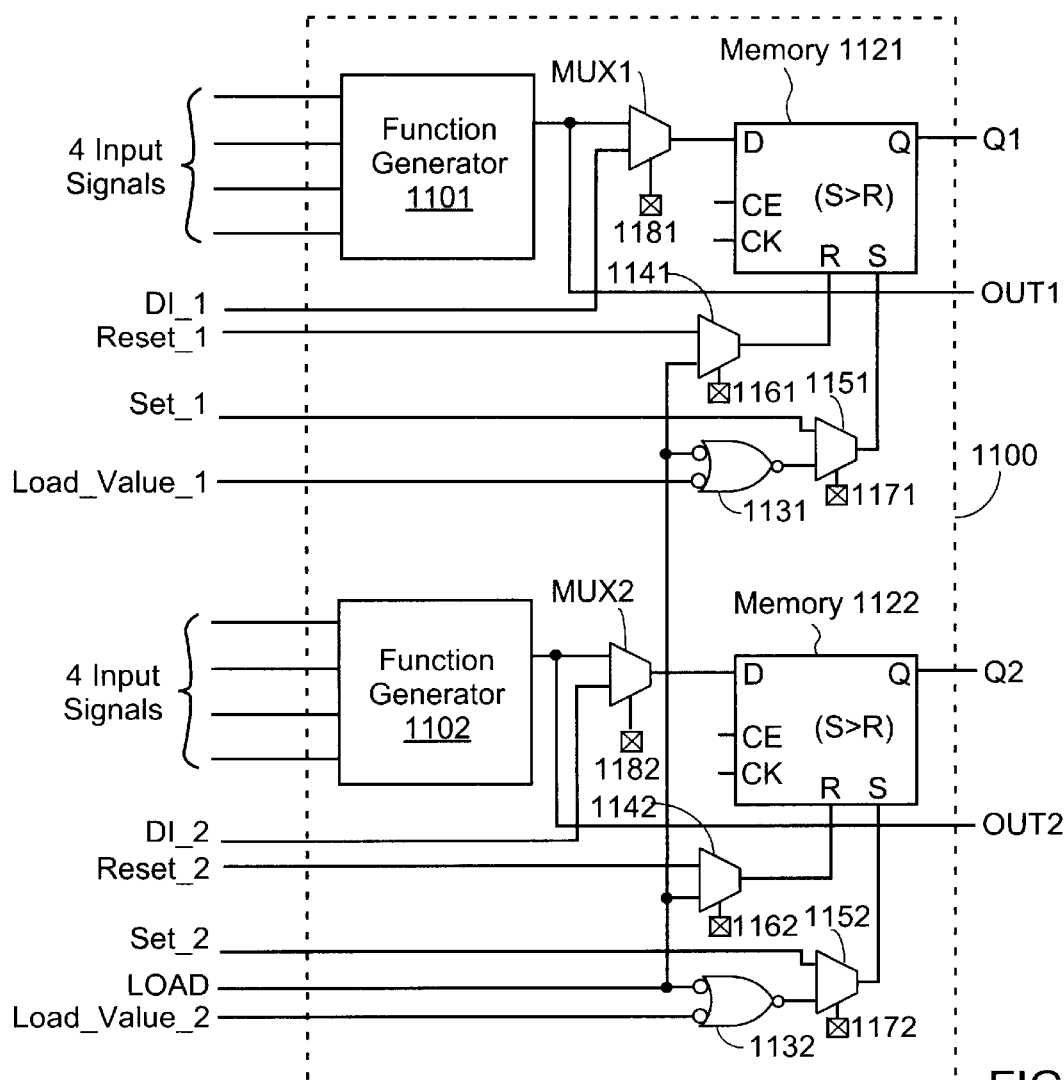
FIG. 11 illustrates a portion of an exemplary CLB architecture that includes one implementation of the circuit of FIG. 10.

FIG. 11 shows an exemplary CLB architecture 1100 that includes the memory element and logical AND gate of FIG. 10 implemented using dedicated (hard-wired) circuits. Circuit 1100 is similar to circuit 500 of FIG. 5, but is altered to conform to the embodiment of FIG. 10. The set terminal of each memory element in CLB 1100 takes precedence over the reset terminal. The set and reset terminals of memory elements 1121, 1122 are reversed compared to memory elements 521, 522 of FIG. 5. The user-controlled set and reset terminals (Set_1,2, Reset_1,2) of the CLB are also reversed. Additionally, the logical AND gate 1002 of FIG. 10 does not use an inverted Load_Value input signal. Therefore, logical AND gate 1002 is implemented in CLB 1100 as NOR gates 1131, 1132 with two inverted inputs.

In other embodiments, logical AND gate 1002 is implemented as a NAND gate, and the set terminal of each memory element is an active-low input terminal. Many different implementations of a logical AND gate are well known and can be used in various embodiments of the invention.

Figure 12:
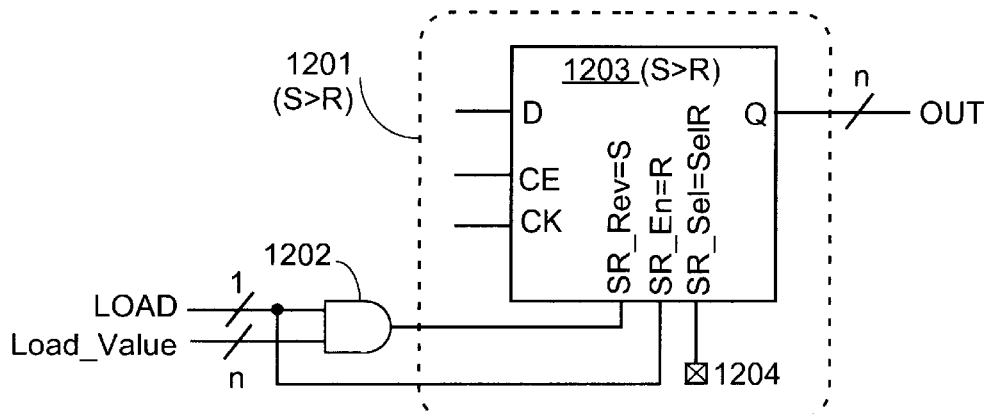
FIG. 12 shows one way in which the circuit of FIG. 10 can be implemented using one type of memory element.
Figure 13:
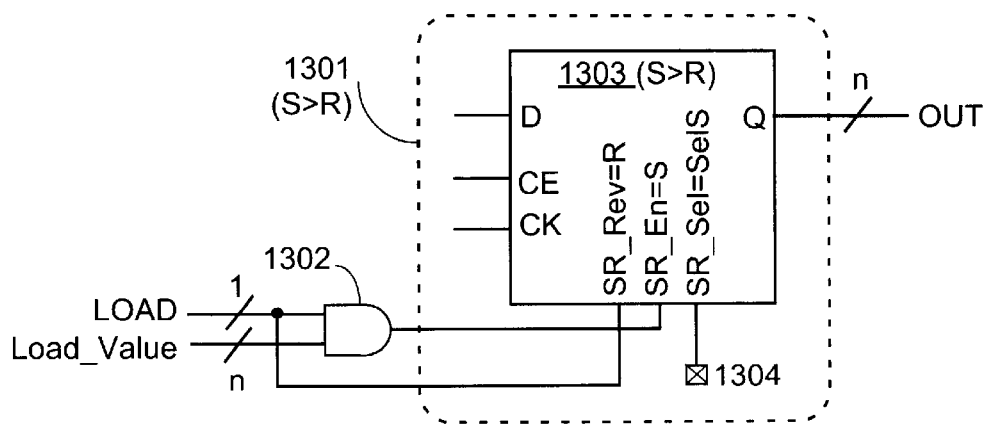
FIG. 13 shows another way in which the circuit of FIG. 10 can be implemented using the same type of memory element as in FIG. 12.

FIGS. 12 and 13 illustrate exemplary implementations of the embodiment of FIG. 10 that include a PLD memory element having SR_Sel, SR_En, and SR_Sel input signals. In the embodiments of FIGS. 12 and 13, if both signals SR_En and SR_Rev are active, the signal performing the set function takes precedence, and the signal performing the reset function is ignored.

Therefore, either the SR_En or the SR_Rev terminal can be used to provide the set signal, depending on the value of signal SR_Sel, which is stored in configuration memory cell 1204 (FIG. 12) or 1304 (FIG. 13). The one of these two input terminals that is not providing the set signal is used to provide the reset signal.

In FIG. 12, the portion of the figure labeled 1201 illustrates one embodiment of memory element 1001 of FIG. 10. Portion 1201 includes memory element 1203 and configuration memory cell 1204. Configuration memory cell 1204 is set to a value that designates the SR_En terminal as the reset terminal and the SR_Rev terminal as the set terminal. (As shown in FIG. 12, the value SR_Sel=SelR indicates that the reset function is assigned to the SR_En terminal.) Thus, the output of logical AND gate 1202 (which is the set signal, as shown in FIG. 10) is coupled to the SR_Rev terminal of memory element 1203. The load command input terminal LOAD provides the reset signal, as shown in FIG. 10. Therefore, the LOAD terminal is coupled to the SR_En terminal of memory element 1203.

In FIG. 13, the portion of the figure labeled 1301 illustrates another embodiment of memory element 1001 of FIG. 10. Portion 1301 includes memory element 1303 and configuration memory cell 1304. Configuration memory cell 1304 is set to a value that designates the SR_En terminal as the set terminal and the SR_Rev terminal as the reset terminal. (As shown in FIG. 13, the value SR_Sel=SelS indicates that the set function is assigned to the SR_En terminal.) Thus, the output of logical AND gate 1302 (which is the set signal, as shown in FIG. 10) is coupled to the SR_En terminal of memory element 1303. The load command input terminal LOAD provides the reset signal, as shown in FIG. 10. Therefore, the LOAD terminal is coupled to the SR_Rev terminal of memory element 1303.

Figure 14:
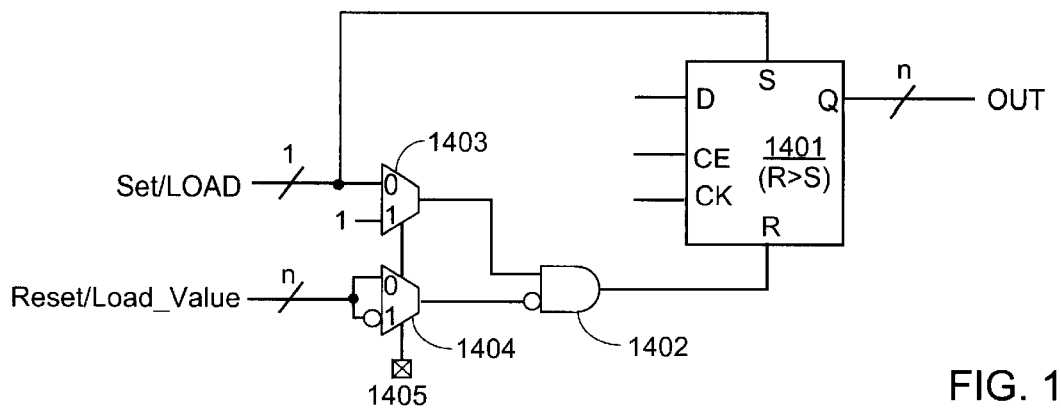
FIG. 14 is a circuit diagram of a third register circuit having an optional load function that bypasses the data input terminal of the register.

FIG. 14 is a circuit diagram illustrating another embodiment of the invention, a register circuit similar to that of FIG. 2 but having additional functionality. Depending on the contents of a configuration memory cell 1405, a signal on the set/load command input terminal (Set/LOAD) can also function as a user-controlled set signal. Similarly, a signal on the reset/load value input terminal (Reset/Load_Value) can also function as a user-controlled reset signal. This embodiment is particularly suited to implementations where both load and set/reset functions are needed, but it is desirable to minimize the number of input terminals to the register circuit.

The register circuit of FIG. 14 includes a set/reset memory element 1401 and a logical AND gate 1402. Memory element 1401 has both set and reset input terminals. Importantly, in the embodiment of FIG. 14 an active signal on the reset terminal takes precedence over an active signal on the set terminal.

Logical AND gate 1402 has a first input terminal coupled to receive an output signal from a first multiplexer 1403, a second input terminal coupled to receive an inverted output signal from a second multiplexer 1404, and an output terminal coupled to the reset terminal of memory element 1401. Multiplexer 1403 has a first data input terminal coupled to set/load command input terminal (Set/LOAD) and further coupled to the set terminal of memory element 1401, and a second data input terminal coupled to a logical high signal (e.g., power high VDD). Multiplexer 1404 has a first data input terminal coupled to a reset/load value input terminal (Reset/Load_Value) and a second data input terminal coupled to the inverse of signal Reset/Load_Value. Both multiplexers 1403, 1404 are controlled by a value stored in configuration memory cell 1405.

When the value stored in memory cell 1405 is low, the register circuit of FIG. 14 is in load mode, and functions as described above in relation to FIG. 2. When the value stored in memory cell 1405 is high, the register circuit of FIG. 14 is in set/reset mode. (Of course, the two modes can be reversed simply by reversing the "0" and "1" inputs shown for the two multiplexers 1403, 1404.) In set/reset mode, the output of multiplexer 1403 is always high, so logical AND gate 1402 functions as an inverter. The Reset/Load_Value is inverted once by multiplexer 1404, and again by logical AND gate 1402. Therefore, signal Reset/Load_Value is provided to the reset terminal of memory element 1401. The Set/LOAD signal is also provided to the set terminal of memory element 1401.

Figure 15:
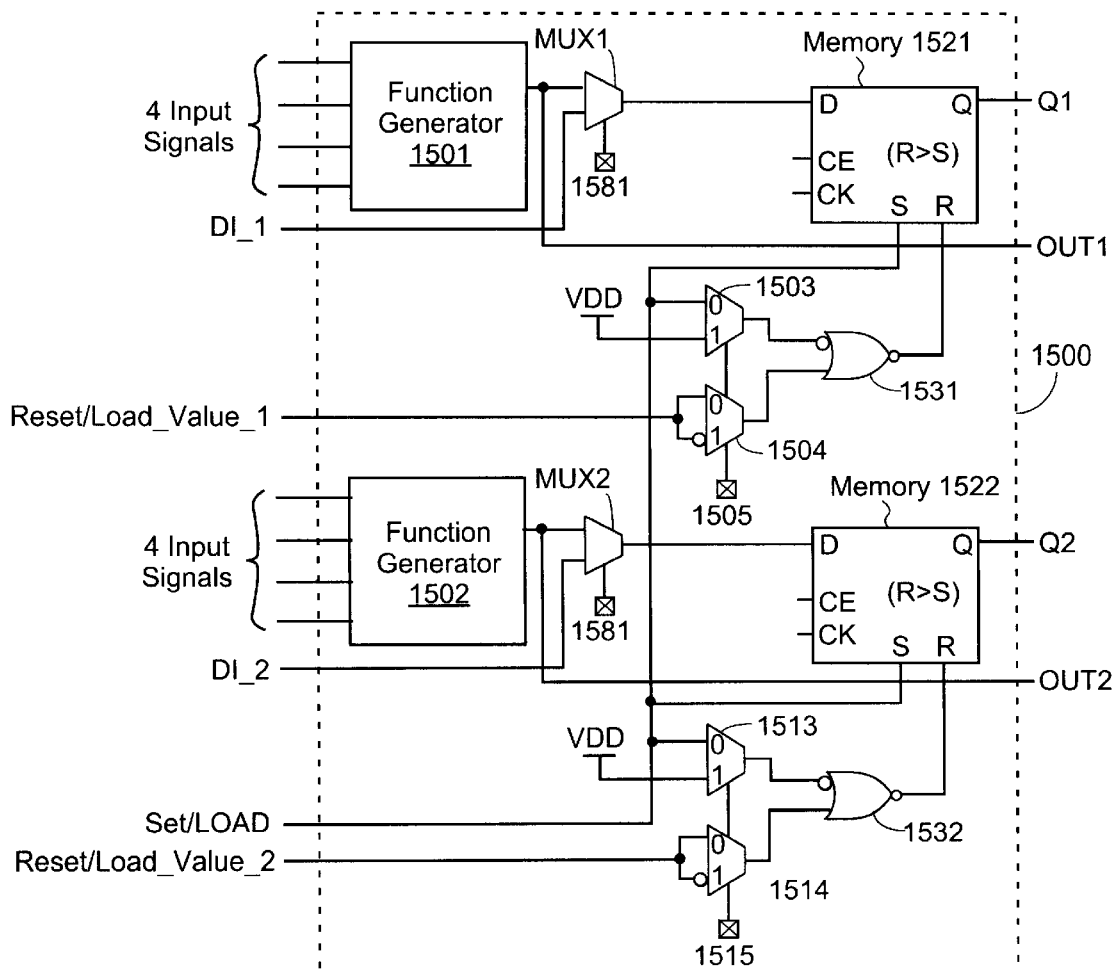
FIG. 15 illustrates a portion of an exemplary CLB architecture that includes one implementation of the circuit of FIG. 14.

FIG. 15 shows an exemplary CLB architecture 1500 that includes the various elements of FIG. 14 implemented using dedicated circuits. Circuit 1500 is similar to circuit 300 of FIG. 3, but includes the multiplexers of FIG. 14.

Figure 16:
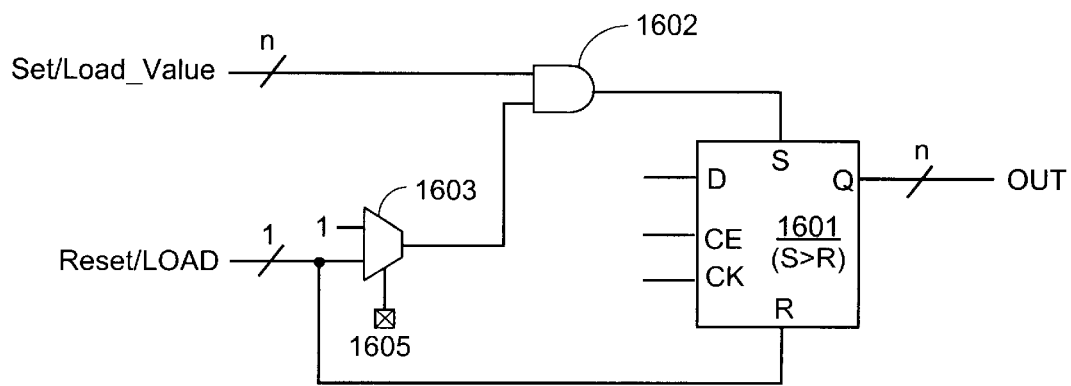
FIG. 16 is a circuit diagram of a fourth register circuit having an optional load function that bypasses the data input terminal of the register.

FIG. 16 is a circuit diagram illustrating yet another embodiment of the invention, a register circuit similar to that of FIG. 10 but having additional functionality. Depending on the contents of a configuration memory cell 1605, a signal on the reset/load command input terminal (Reset/LOAD) can also function as a user-controlled reset signal. Similarly, a signal on the set/load value input terminal (Set/Load_Value) can also function as a user-controlled set signal. This embodiment is also similar to the register circuit of FIG. 14, but is adapted to use a memory element having a set function that overrides the reset function.

The register circuit of FIG. 16 includes a set/reset memory element 1601 and a logical AND gate 1602. Memory element 1601 has both set and reset input terminals. Importantly, in the embodiment of FIG. 16 an active signal on the set terminal takes precedence over an active signal on the reset terminal.

Logical AND gate 1602 has a first input terminal coupled to the set/load value input terminal (Set/Load_Value), a second input terminal coupled to receive an output signal from a multiplexer 1603, and an output terminal coupled to the set terminal of memory element 1601. Multiplexer 1603 has a first data input terminal coupled to reset/load command input terminal (Reset/LOAD) and further coupled to the reset terminal of memory element 1601, and a second data input terminal coupled to a logical high signal (e.g., power high VDD). Multiplexer 1603 is controlled by a value stored in configuration memory cell 1605.

When memory cell 1605 stores a first value, the register circuit of FIG. 16 is in load mode, and functions as described above in relation to FIG. 10. When memory cell 1605 stores a second value, the register circuit of FIG. 16 is in set/reset mode. In set/reset mode, the output of multiplexer 1603 is always high, so logical AND gate 1602 simply passes the Set/Load_Value signal to the set terminal of memory element 1601. The Reset/LOAD signal is also provided to the reset terminal of memory element 1601.

Figure 17:
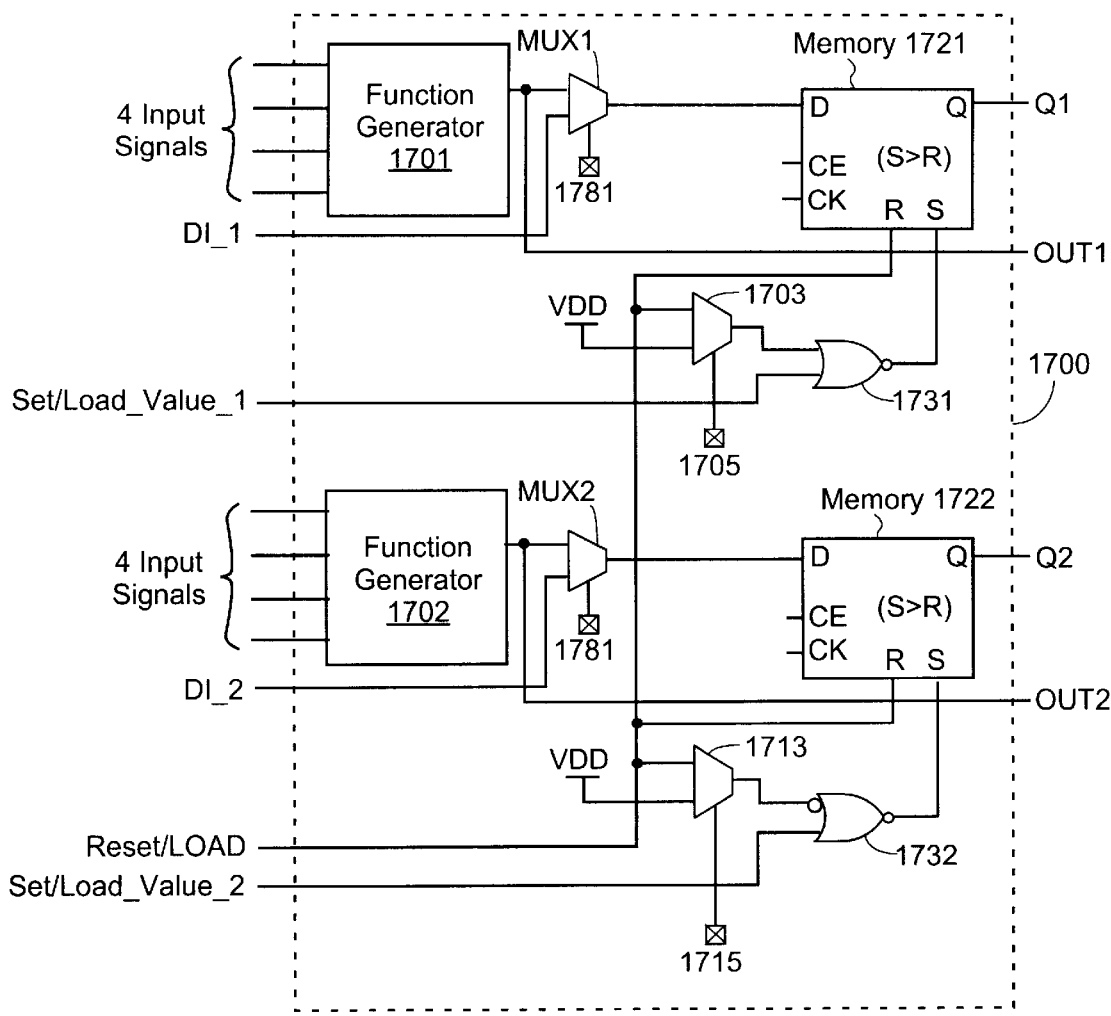
FIG. 17 illustrates a portion of an exemplary CLB architecture that includes one implementation of the circuit of FIG. 15.

FIG. 17 shows an exemplary CLB architecture 1700 that includes the various elements of FIG. 16 implemented using dedicated circuits. Circuit 1700 is similar to circuit 1100 of FIG. 11, but includes the multiplexers of FIG. 16 rather than the multiplexers shown in FIG. 11.

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other electronic systems, for example, in non-programmable ICs or printed circuit boards including discrete devices.

Further, logical AND gates, NOR gates, NAND gates, multiplexers, function generators, registers, memory elements, slices, CLBs, FPGAs, PLDs, and other components other than those described herein can be used to implement the invention. Active-high signals can be replaced with active-low signals by making straightforward alterations to the circuitry, such as are well known in the art of circuit design. Logical circuits and logic gates can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A register circuit, comprising:
   a load command input terminal;
   a first load value input terminal;
   a first memory element having a data input terminal, a clock terminal, a set terminal coupled to the load command input terminal, a reset terminal, and a register output terminal, wherein an active signal on the reset terminal takes precedence over an active signal on the set terminal; and
   a first logical AND gate having a first input terminal coupled to the load command input terminal, a second input terminal coupled to the first load value input terminal, and an output terminal coupled to the reset terminal of the first memory element.

2. The register circuit of claim 1, further comprising:
   a second load value input terminal;
   a second memory element having a data input terminal, a clock terminal, a set terminal coupled to the load command input terminal, a reset terminal, and a register output terminal; and
   a second logical AND gate having a first input terminal coupled to the load command input terminal, a second input terminal coupled to the second load value input terminal, and an output terminal coupled to the reset terminal of the second memory element.

3. The register circuit of claim 1, wherein the first logical AND gate includes an inversion function between the first load value input terminal and the second input terminal of the first logical AND gate.

4. The register circuit of claim 1, wherein the first logical AND gate is implemented as a NOR gate with input signals inverted from those of the first logical AND gate.

5. The register circuit of claim 1, wherein the register circuit comprises a portion of a programmable logic device (PLD), the register circuit further comprising:
   programmable means for configuring the first load value input terminal as a reset terminal and the load command input terminal as a set terminal.

6. The register circuit of claim 1, wherein:
   the register circuit comprises a portion of a programmable logic device (PLD);
   the PLD comprises a plurality of memory elements and a plurality of programmable function generators;
   the first memory element comprises one of the plurality of memory elements; and
   the first logical AND gate is implemented by programming one of the plurality of programmable function generators to perform a logical AND function.

7. The register circuit of claim 1, wherein:

the register circuit comprises a portion of a programmable logic device (PLD);

the PLD comprises a plurality of memory elements and a plurality of dedicated logical AND gates;

the first memory element comprises one of the plurality of memory elements; and the first logical AND gate comprises one of the plurality of dedicated logical AND gates.

8. The register circuit of claim 1, wherein the first memory element comprises:

a configuration memory cell;

a set/reset enable terminal coupled to the reset terminal of the first memory element;

a reverse enable terminal coupled to the set terminal of the first memory element; and a set/reset select terminal coupled to the configuration memory cell, a value stored in the configuration memory cell designating the set/reset enable terminal to perform the reset function and the reverse enable terminal to perform the set function.

9. The register circuit of claim 1, wherein the first memory element comprises:

a configuration memory cell;

a set/reset enable terminal coupled to the set terminal of the first memory element;

a reverse enable terminal coupled to the reset terminal of the first memory element; and a set/reset select terminal coupled to the configuration memory cell, a value stored in the configuration memory cell designating the set/reset enable terminal to perform the set function and the reverse enable terminal to perform the reset function.

10. A configurable logic block (CLB) in a programmable logic device (PLD), comprising:

a load command input terminal;

a first load value input terminal;

a first function generator having a plurality of input terminals and an output terminal;

a first memory element having a data input terminal coupled to the output terminal of the first function generator, a clock terminal, a set terminal coupled to the load command input terminal, a reset terminal, and a register output terminal, wherein an active signal on the reset terminal takes precedence over an active signal on the set terminal; and a first logical AND gate having a first input terminal coupled to the load command input terminal, a second input terminal coupled to the first load value input terminal, and an output terminal coupled to the reset terminal of the first memory element.

11. The CLB of claim 10, further comprising:

a second load value input terminal;

a second function generator having a plurality of input terminals and an output terminal;

a second memory element having a data input terminal coupled to the output terminal of the second function generator, a clock terminal, a set terminal coupled to the load command input terminal, a reset terminal, and a register output terminal; and a second logical AND gate having a first input terminal coupled to the load command input terminal, a second input terminal coupled to the second load value input terminal, and an output terminal coupled to the reset terminal of the second memory element.

12. The CLB of claim 10, wherein the first logical AND gate includes an inversion function between the first load value input terminal and the second input terminal of the first logical AND gate.

13. The CLB of claim 10, wherein the first logical AND gate is implemented as a NOR gate with input signals inverted from those of the logical AND gate.

14. The register circuit of claim 10, further comprising:

programmable means for configuring the first load value input terminal as a reset terminal and the load command input terminal as a set terminal.

15. The CLB of claim 10, wherein the first memory element comprises:

a configuration memory cell;

a set/reset enable terminal coupled to the reset terminal of the first memory element;

a reverse enable terminal coupled to the set terminal of the first memory element; and a set/reset select terminal coupled to the configuration memory cell, a value stored in the configuration memory cell designating the set/reset enable terminal to perform the reset function and the reverse enable terminal to perform the set function.

16. The CLB of claim 10, wherein the first memory element comprises:

a configuration memory cell;

a set/reset enable terminal coupled to the set terminal of the first memory element;

a reverse enable terminal coupled to the reset terminal of the first memory element; and a set/reset select terminal coupled to the configuration memory cell, a value stored in the configuration memory cell designating the set/reset enable terminal to perform the set function and the reverse enable terminal to perform the reset function.

17. A register circuit, comprising:

a load command input terminal;

a first load value input terminal;

a first memory element having a data input terminal, a clock terminal, a reset terminal coupled to the load command input terminal, a set terminal, and a register output terminal, wherein an active signal on the set terminal takes precedence over an active signal on the reset terminal; and a first logical AND gate having a first input terminal coupled to the load command input terminal, a second input terminal coupled to the first load value input terminal, and an output terminal coupled to the set terminal of the first memory element.

18. The register circuit of claim 17, further comprising:

a second load value input terminal;

a second memory element having a data input terminal, a clock terminal, a reset terminal coupled to the load command input terminal, a set terminal, and a register output terminal; and a second logical AND gate having a first input terminal coupled to the load command input terminal, a second input terminal coupled to the second load value input terminal, and an output terminal coupled to the set terminal of the second memory element.

19. The register circuit of claim 17, wherein the first logical AND gate is implemented as a NOR gate with input signals inverted from those of the logical AND gate.

20. The register circuit of claim 17, wherein the register circuit comprises a portion of a programmable logic device (PLD), the register circuit further comprising:

programmable means for configuring the first load value input terminal as a set terminal and the load command input terminal as a reset terminal.

21. The register circuit of claim 17, wherein:

the register circuit comprises a portion of a programmable logic device (PLD);

the PLD comprises a plurality of memory elements and a plurality of programmable function generators;

the first memory element comprises one of the plurality of memory elements; and the first logical AND gate is implemented by programming one of the plurality of programmable function generators to perform a logical AND function.

22. The register circuit of claim 17, wherein:

the register circuit comprises a portion of a programmable logic device (PLD);

the PLD comprises a plurality of memory elements and a plurality of dedicated logical AND gates;

the first memory element comprises one of the plurality of memory elements; and the first logical AND gate comprises one of the plurality of dedicated logical AND gates.

23. The register circuit of claim 17, wherein the first memory element comprises:

a configuration memory cell;

a set/reset enable terminal coupled to the reset terminal of the first memory element;

a reverse enable terminal coupled to the set terminal of the first memory element; and a set/reset select terminal coupled to the configuration memory cell, a value stored in the configuration memory cell designating the set/reset enable terminal to perform the reset function and the reverse enable terminal to perform the set function.

24. The register circuit of claim 17, wherein the first memory element comprises:

a configuration memory cell;

a set/reset enable terminal coupled to the set terminal of the first memory element;

a reverse enable terminal coupled to the reset terminal of the first memory element; and a set/reset select terminal coupled to the configuration memory cell, a value stored in the configuration memory cell designating the set/reset enable terminal to perform the set function and the reverse enable terminal to perform the reset function.

25. A configurable logic block (CLB) in a programmable logic device (PLD), comprising:

a load command input terminal;

a first load value input terminal;

a first function generator having a plurality of input terminals and an output terminal;

a first memory element having a data input terminal coupled to the output terminal of the first function generator, a clock terminal, a reset terminal coupled to the load command input terminal, a set terminal, and a register output terminal, wherein an active signal on the set terminal takes precedence over an active signal on the reset terminal; and a first logical AND gate having a first input terminal coupled to the load command input terminal, a second input terminal coupled to the first load value input terminal, and an output terminal coupled to the set terminal of the first memory element.

26. The CLB of claim 25, further comprising:

a second load value input terminal;

a second function generator having a plurality of input terminals and an output terminal;

a second memory element having a data input terminal coupled to the output terminal of the second function generator, a clock terminal, a reset terminal coupled to the load command input terminal, a set terminal, and a register output terminal; and a second logical AND gate having a first input terminal coupled to the load command input terminal, a second input terminal coupled to the second load value input terminal, and an output terminal coupled to the set terminal of the second memory element.

27. The CLB of claim 25, wherein the first logical AND gate is implemented as a NOR gate with input signals inverted from those of the logical AND gate.

28. The register circuit of claim 25, further comprising:

programmable means for configuring the first load value input terminal as a set terminal and the load command input terminal as a reset terminal.

29. The CLB of claim 25, wherein the first memory element comprises:

a configuration memory cell;

a set/reset enable terminal coupled to the reset terminal of the first memory element;

a reverse enable terminal coupled to the set terminal of the first memory element; and a set/reset select terminal coupled to the configuration memory cell, a value stored in the configuration memory cell designating the set/reset enable terminal to perform the reset function and the reverse enable terminal to perform the set function.

30. The CLB of claim 25, wherein the first memory element comprises:

a configuration memory cell;

a set/reset enable terminal coupled to the set terminal of the first memory element;

a reverse enable terminal coupled to the reset terminal of the first memory element; and a set/reset select terminal coupled to the configuration memory cell, a value stored in the configuration memory cell designating the set/reset enable terminal to perform the set function and the reverse enable terminal to perform the reset function.

* * * * *